United States Patent
Fournel et al.

(10) Patent No.: US 10,497,609 B2
(45) Date of Patent: Dec. 3, 2019

(54) METHOD FOR DIRECT BONDING OF SUBSTRATES INCLUDING THINNING OF THE EDGES OF AT LEAST ONE OF THE TWO SUBSTRATES

(71) Applicant: COMMISSARIAT A L'ENERGIE ATOMIQUE ET AUX ENERGIES ALTERNATIVES, Paris (FR)

(72) Inventors: Frank Fournel, Villard-Bonnot (FR); Christophe Morales, St Pierre de Mesage (FR); Hubert Moriceau, Saint-Egreve (FR); Francois Rieutord, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 6 days.

(21) Appl. No.: 15/571,573

(22) PCT Filed: May 10, 2016

(86) PCT No.: PCT/EP2016/060448
§ 371 (c)(1),
(2) Date: Nov. 3, 2017

(87) PCT Pub. No.: WO2016/180828
PCT Pub. Date: Nov. 17, 2016

(65) Prior Publication Data
US 2018/0158719 A1    Jun. 7, 2018

(30) Foreign Application Priority Data
May 11, 2015 (FR) ..................... 15 54182

(51) Int. Cl.
*H01L 21/762* (2006.01)
*H01L 21/02* (2006.01)
(Continued)

(52) U.S. Cl.
CPC .. *H01L 21/76251* (2013.01); *H01L 21/02021* (2013.01); *H01L 21/2007* (2013.01);
(Continued)

(58) Field of Classification Search
CPC ... H01L 24/71; H01L 24/90; H01L 21/02021; H01L 24/83; H01L 21/2007; H01L 2224/80896; H01L 2224/80894
See application file for complete search history.

(56) References Cited

U.S. PATENT DOCUMENTS 5,152,857 A    10/1992  Ito et al.
5,668,045 A *  9/1997  Golland ............ H01L 21/76251
                                              148/DIG. 12
(Continued)

FOREIGN PATENT DOCUMENTS

EP    0 451 993 A2    10/1991
EP    2 115 768       11/2009
WO    2013/160841 A1  10/2013

OTHER PUBLICATIONS

International Search Report dated Jul. 29, 2016 in PCT/EP2016/060448 filed May 10, 2016.
(Continued)

*Primary Examiner* — Bac H Au
(74) *Attorney, Agent, or Firm* — Oblon, McClelland, Maier & Neustadt, L.L.P.

(57) ABSTRACT

A method for direct bonding between at least a first and a second substrate, each of the first and second substrates containing a first and a second main surface, the method including: a first thinning of the edges of the first substrate over at least one portion of the circumference of the first substrate, at the first main surface of the first substrate; and placing the second main surface of the first substrate in contact with the second main surface of the second substrate such that a bonding wave propagates between the first and
(Continued)

second substrates, securing the first and second substrates to one another by direct bonding such that portions of the second main surface of the first substrate located below the thinned portions of the first main surface of the first substrate are secured to the second substrate.

10 Claims, 1 Drawing Sheet

(51) Int. Cl.
  *H01L 23/00*    (2006.01)
  *H01L 21/20*    (2006.01)
  *H01L 27/12*    (2006.01)

(52) U.S. Cl.
  CPC .............. *H01L 24/71* (2013.01); *H01L 24/83* (2013.01); *H01L 24/90* (2013.01); *H01L 27/1203* (2013.01); *H01L 2224/80894* (2013.01); *H01L 2224/80896* (2013.01)

(56) References Cited

U.S. PATENT DOCUMENTS

| | | | |
|---|---|---|---|
| 5,937,312 A * | 8/1999 | Iyer | H01L 21/3226 148/DIG. 12 |
| 8,158,487 B2 * | 4/2012 | Sousbie | H01L 21/2007 257/E21.079 |
| 8,278,189 B2 * | 10/2012 | Hsieh | H01L 21/304 257/E21.568 |
| 8,298,916 B2 * | 10/2012 | Vaufredaz | H01L 21/76256 257/E21.088 |
| 8,329,048 B2 * | 12/2012 | Zussy | H01L 21/76251 156/60 |
| 8,476,148 B2 * | 7/2013 | Kerdiles | H01L 21/02032 438/458 |
| 8,679,944 B2 * | 3/2014 | Broekaart | H01L 21/304 257/E21.237 |
| 8,927,320 B2 * | 1/2015 | Lagahe Blanchard | H01L 21/2007 156/538 |
| 2003/0008478 A1 * | 1/2003 | Abe | B24B 9/065 438/459 |
| 2004/0121557 A1 | 6/2004 | Ghyselen | |
| 2005/0215056 A1 * | 9/2005 | Morrow | H01L 21/187 438/689 |
| 2005/0233544 A1 | 10/2005 | Ghyselen | |
| 2007/0072393 A1 | 3/2007 | Aspar et al. | |
| 2007/0148914 A1 | 6/2007 | Morita et al. | |
| 2008/0286939 A1 | 11/2008 | Ohnuma | |
| 2010/0087046 A1 | 4/2010 | Ohnuma | |
| 2011/0315900 A1 | 12/2011 | Ohnuma | |
| 2012/0161292 A1 * | 6/2012 | Halimaoui | H01L 21/76251 257/618 |

OTHER PUBLICATIONS

French Search Report dated Feb. 29, 2016 in FR 1554182 filed May 11, 2015.

* cited by examiner

METHOD FOR DIRECT BONDING OF SUBSTRATES INCLUDING THINNING OF THE EDGES OF AT LEAST ONE OF THE TWO SUBSTRATES

TECHNICAL FIELD AND PRIOR ART

The invention relates to a method of direct bonding of two substrates to each other during which a thinning of the edges of at least one of both substrates is made to avoid the occurrence of bonding defects at the edges of the substrates. By substrate, it is meant a wafer, for example of semiconductor (generally of silicon), having undergone or not microelectronic technological steps forming for example electronic components in the substrate. These microelectronic technological steps are for example lithography, etching and depositing steps.

Direct bonding, also called "molecular bonding", or even "wafer bonding", is an assembling technique enabling two surfaces to be secured through direct contacting of both these surfaces without involving a bonding material (glue, wax, etc.). In this bonding type, the adhesion is achieved by virtue of the fact that the surfaces to be bonded are sufficiently smooth (typically with a roughness in the order of 0.5 nm), free of particles or contaminations, and moved close enough to each other to enable a close contact to be initiated between them. In this case, the attractive forces between both surfaces are high enough to cause a molecular adhesion of both surfaces with each other. The molecular bonding is induced by all the electronic interaction attractive forces between the atoms or molecules of the two materials to be bonded (Van der Waals forces). Heat treatments can be made during or after bonding to increase the bonding energy between the assembled surfaces.

Such a direct bonding can correspond to a so-called "hydrophobic" bonding, for example between two substrates of single crystal silicon without surface oxide and with surfaces passivated by Si—H bonds for example. In this case, the direct bonding forms a crystalline "connection" between the bonded materials. Direct bonding can also correspond to a so-called "hydrophilic" bonding, for example between two substrates of oxidised silicon. In such a hydrophilic bonding, the silanol bonds (Si—OH) of surfaces and a water film present between both surfaces enable hydrogen bonding interactions stronger than Van der Waals forces obtained with hydrogen passivated surfaces with Si—H bonds in the case of hydrophobic bonding to be achieved.

After contacting both substrates intended to be bonded to each other, a slight mechanical pressure is applied to the substrates in order to initiate direct bonding. This pressure enables the materials of both substrates to be brought to a distance low enough such that the attractive forces between the atoms or molecules of both surfaces to be bonded can be established. A bonding wave then propagates from the pressure point, generally at the centres of the substrates, throughout the surfaces, resulting in both substrates being closely bonded. This operation is generally made at ambient temperature and at ambient pressure. Thus, this bonding wave will, among other things, discharge air and part of the water present between both surfaces just before being propagated. This discharge generates an overpressure of about two atmospheres at the bonding wavefront.

When the bonding wave comes at the edges of the substrates, an adiabatic expansion occurs and can cause the appearance of defects at the edges of the substrates, even if the surfaces of these edges are exactly identical to those at the centres of the substrates. Such defects can also appear later, for example upon implementing heat treatments made to increase the bonding energy between the substrates.

These bonding defects due to the propagation of the bonding wave mainly appear upon implementing a hydrophilic direct bonding because during such a bonding, the bonding wave propagates more quickly than during a hydrophobic direct bonding. The overpressure is thus higher, as well as the adiabatic expansion, in the case of a hydrophilic direct bonding. However, such defects can potentially appear during a hydrophobic direct bonding.

To solve these problems, document EP 2 115 768 suggests making heating of the substrates at least until they are contacted with each other. Alternatively, document WO 2013/160841 suggests solving these problems by making bonding under a Helium atmosphere.

The solutions suggested in the abovementioned documents however require to modify some properties of the atmosphere (temperature, pressure and nature of the gases present) in which the direct bonding is made. But, that is very restrictive because the atmosphere of the machines in which the direct bonding between two substrates is made is generally unmodifiable. Moreover, the modification of the direct bonding implementation conditions could also modify the performance of the bonding made.

DISCLOSURE OF THE INVENTION

One purpose of the present invention is to provide a method of direct bonding between at least two substrates enabling the appearance of bonding defects due to the propagation of the bonding wave to be avoided, and in which contacting both substrates can be made at ambient temperature and at ambient pressure, for example under the atmosphere of a clean room (comprising air at about 50% relative humidity at 21° C.).

To that end, the invention provides a method of direct bonding between at least a first and a second substrate, each of the first and second substrates including a first and a second main face, including at least the steps of:

firstly thinning edges of the first substrate on at least one part of the circumference of the first substrate, at the first main face of the first substrate;

contacting the second main face of the first substrate with the second main face of the second substrate such that a bonding wave propagates between the first and second substrates, securing the first and second substrates to each other by direct bonding.

Securing the first and second substrates to each other may be such that parts of the second main face of the first substrate located under, or directly above, the thinned parts of the first main face of the first substrate are secured to the second substrate.

The method according to the invention suggests making, prior to contacting the substrates to be secured, a thinning of the edges of the first substrate on at least one part of the circumference of the first substrate. The fact that the edges of the first substrate are thinned enables the first substrate to be made less rigid at these edges. Thus, after contacting both substrates, when the bonding wave comes at these edges, the first substrate is capable of being slightly deformed in order to avoid the formation of defects due to the adiabatic expansion occurring when the bonding wave passes at the edges of the substrates.

The thinned edge obtained by implementing the first thinning is different from a conventional chamfer made at the edges of a substrate. Indeed, a conventional chamfer does not provide any flexibility to the substrates when the substrates are secured to each other because the parts of the substrates including the chamfers are not intended to be bonded to each other. In the invention, the flexibility is provided by virtue of the first thinning which is made on a larger part of the edges than that at which the chamfers are made, which results in that at the end of the bonding, the parts of the second main face of the first substrate located under the thinned parts of the first main face of the first substrate are secured to the second substrate. The flexibility is thus achieved because the thinning is made on parts of the first substrate which are to be bonded to the second substrate.

When the bonding wave is initiated from an initiating point located at the edges of the first and second substrates, said at least one part of the circumference of the first substrate may correspond to at least one third of the circumference of the first substrate and located opposite to the initiating point.

The bonding wave may be initiated by applying a mechanical pressure on at least one of both substrates.

Advantageously, the first thinning may be made on the entire circumference of the first substrate. This configuration is advantageously made when the initiating point of the bonding wave is located substantially at the centres of the substrates.

The first thinning may be made such that a difference between a minimum thickness of the thinned edges of the first substrate and a thickness of edges of the second substrate is higher than or equal to about 20% or 25%, and a minimum value from the minimum thickness of the thinned edges of the first substrate and the thickness of the edges of the second substrate is lower than or equal to about 580 µm or 544 µm. Thus, besides the fact that the thinner edges from the thinned edges of the first substrate and the edges of the second substrate have a thickness lower than or equal to about 580 µm or 544 µm, the minimum thickness of the thinned edges of the first substrate may be lower than or equal to about 80% or 75% of the thickness of the edges of the second substrate, or the thickness of the edges of the second substrate may be lower than or equal to about 80% or 75% of the minimum thickness of the thinned edges of the first substrate.

The first thinning may be made such that a difference between a minimum thickness of the thinned edges of the first substrate and a thickness of the other parts of the first substrate is higher than or equal to about 20% or 25%.

The first thinning may be made such that a width of the thinned edges of the first substrate is between about 1% and 25% of the diameter of the first substrate. The width corresponds to the dimension parallel to the diameter of the first substrate.

The first thinning may be made such that the thickness of the thinned edges of the first substrate is substantially constant, or such that the thickness of the thinned edges decreases on at least one part of the width of the thinned edges, or such that the thickness of the thinned edges varies according to a profile including at least two slopes.

The method may further include, before contacting the second main face of the first substrate with the second main face of the second substrate, implementing a second thinning of at least one part of edges of the second substrate, at the first main face of the second substrate.

The direct bonding securing the first and second substrates to each other may correspond to a hydrophilic direct bonding.

The first and second substrates may each include a semiconductor, and may further include, before contacting the second main face of the first substrate with the second main face of the second substrate, implementing an oxidation of at least the second main face of at least one of the first and second substrates.

The method may further include, between the first thinning and the contacting of the second main face of the first substrate with the second main face of the second substrate, implementing a polishing of one end of the thinned edges of the first substrate.

BRIEF DESCRIPTION OF THE DRAWINGS

The present invention will be better understood upon reading the description of exemplary embodiments given by way of purely indicating and in no way limiting purposes in reference to the appended drawings in which.

Identical, similar or equivalent parts of the different figures described hereinafter bear the same reference numerals so as to facilitate switching from one figure to the other.

The different parts shown in the figures are not necessarily drawn to a uniform scale, to make the figures more readable.

The different possibilities (alternatives and embodiments) should be understood as being non exclusive of each other and can be combined to each other.

DETAILED DISCLOSURE OF PARTICULAR EMBODIMENTS

Figure 1:
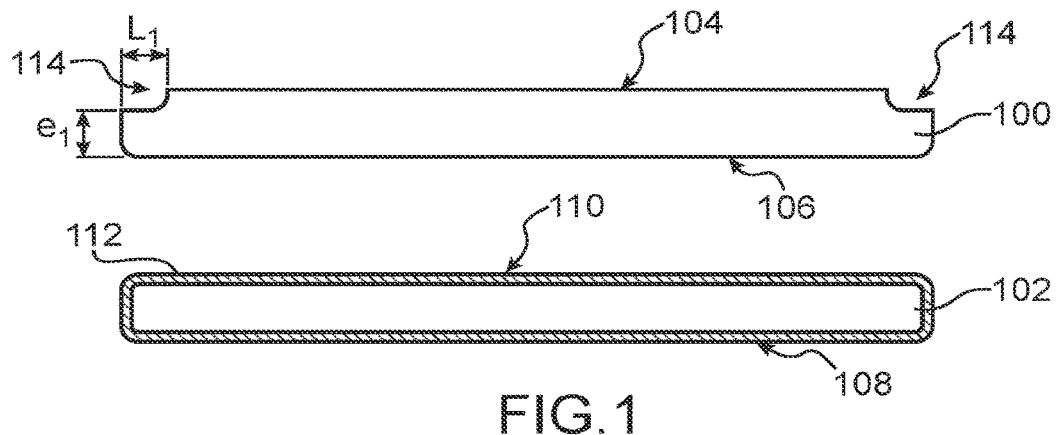
FIGS. 1 and 2 show the steps of a method of direct bonding between two substrates, subject matter of the present invention, according to a particular embodiment.
Figure 2:
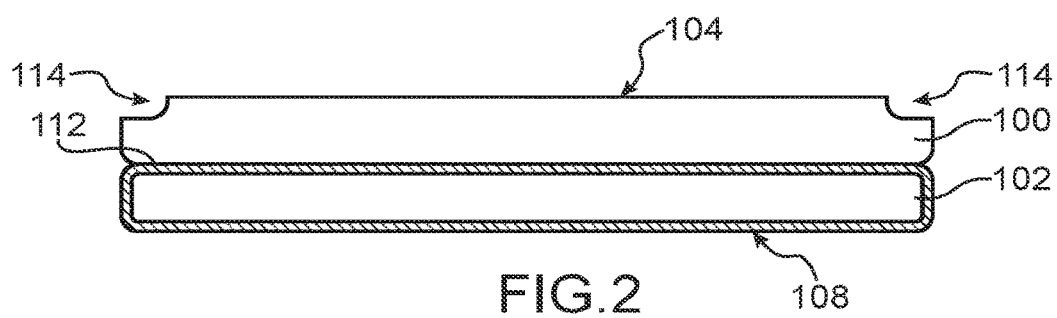

FIGS. 1 and 2 are first referred to, which show the steps of a method of direct bonding between a first substrate 100 and a second substrate 102 according to a particular embodiment.

Each of both substrates 100 and 102 here corresponds to a substrate of silicon having a crystalline orientation <001>, with a diameter equal to 200 mm, with a thickness equal to 725 µm, and a doping P with a resistivity between about 1 Ohm/cm and 10 Ohm/cm. The first substrate 100 includes a first main face 104 and a second main face 106. The second substrate 102 includes a first main face 108 and a second main face 110.

A thermal oxidation of the second substrate 102 is implemented in order to form thereabout a thermal oxide layer 112, here comprising $SiO_2$ because the second substrate 102 is a substrate of silicon. This thermal oxidation is for example made at a temperature equal to about 950° C. under an oxygen atmosphere. The thermal oxide layer 112 has for example a thickness equal to about 50 nm.

A thinning of the edges 114 of the first substrate 100 is then made, for example by lapping, and such that the thickness $e_1$ of the edges 114 after thinning is lower than or equal to about 80% or 75% of the initial thickness of the first substrate 100, that is lower than or equal to about 580 µm or 544 µm in the case of a first substrate 100 with a thickness equal to 725 µm. In the exemplary embodiment described herein, the thickness $e_1$ of the thinned edges 114 is equal to about 500 µm. This thinning of the edges 114 of the first substrate 100 is made at the first main face 104 of the first substrate 100. Moreover, this thinning is made such that a width $L_1$ of the thinned edges 114 is between about 1% and 25% of the diameter of the first substrate 100. In the exemplary embodiment described herein, the width $L_1$ is equal to about 10 mm. The thickness $e_1$ of the thinned edges 114 is substantially constant throughout this width $L_1$.

This thinning is made on a larger part of the edges of the first substrate 100 than that at which the conventional chamfers of a substrate are located.

This thinning here forms, at the edges 114 of the first main face 104 of the first substrate 100, a "step" with a height equal to about 225 µm. FIG. 1 shows the substrates 100 and 102 thus obtained.

In the exemplary embodiment described here, the thinning of the edges 114 is made on the entire circumference of the first substrate 100. Alternatively, in particular when the bonding wave is intended to be initiated from an initiating point located at the edges of the first and second substrates 100, 102, it is possible that this thinning is made only on one part of the circumference of the first substrate 100, this part corresponding to at least one third of the circumference of the first substrate 100 and being located opposite the initiating point of the bonding wave which will be obtained farther.

The first and second substrates 100, 102 are then washed with a solution comprising sulphuric acid and hydrogen peroxide (with about 3 times more sulphuric acid than hydrogen peroxide in the solution), also called SPM ("Sulphuric Peroxide Mixture"), for a duration equal to about 10 minutes, and then rinsed with deionised water for about 10 minutes, and dipped in a solution comprising ammonia, hydrogen peroxide and deionised water (with proportions 1/1/5 in the solution respectively), also called APM ("Ammonium Peroxide Mixture"), for about 10 minutes and at a temperature of about 70° C. A last rinsing with deionised water is made.

The faces 106 and 110 have a roughness compatible with the implementation of a direct bonding, that is a roughness lower than or equal to about 0.5 nm. If the first substrate 100 and/or the second substrate 102 have not a surface roughness compatible with the implementation of a direct bonding, planarization steps can be implemented beforehand in order to make the surfaces compatible with the implementation of a direct bonding.

As shown in FIG. 2, contacting the second main face 106 of the first substrate 100 with the second main face 110 (here formed by a semiconductor oxide) of the second substrate 102 is then made. During this contacting, the second substrate 102 is disposed on a support and the first substrate 100 is then deposited onto the second substrate 102. A pressure can be applied at the centre of the first main face 104 of the first substrate 100 in order to trigger propagation of the bonding wave from the centres of the substrates 100, 102 up to the edges of the substrates 100, 102. The fact that the edges 114 of the first substrate 100 are thinned enables the first substrate 100 to be made less rigid at these edges 100. Thus, when the bonding wave comes at these edges, the first substrate 100 can be slightly deformed in order to avoid the formation of defects due to the adiabatic expansion occurring when the bonding wave passes at the edges of the substrates 100, 102. This step of contacting both substrates 100, 102 is made at ambient temperature and at ambient pressure for example in a clean room with air at about 21° C. and about 50% relative humidity.

At the end of this contacting, the parts of the second main face 106 located under the thinned parts of the first main face 104, that is the parts of the second main face 106 located just above the thinned parts of the first main face 104, are secured to the second substrate 102.

The bonding energy is then enhanced by making annealing of both secured substrates 100, 102, for example at a temperature of 400° C. for 2 hours. Generally, one or more heat treatments enabling adhesion forces between the substrates 100 and 102 to be enhanced can be made. When electronic components are present on at least one of these substrates 100, 102 (at the first faces 104, 108), the temperatures of these heat treatments may be between about 200° C. and 400° C. Otherwise, the temperatures of heat treatments may range up to about 1 100° C.

Prior to contacting the substrates 100 and 102, it is possible to make polishing of the end of the thinned edges 114 of the first substrate 100 in order to "round up" the profile of the thinned edges 114. This polishing can be made by chemical attack. Such a polishing can also enable possible cold-worked zones which could be prone to embrittlement for bonding to be removed.

In the particular embodiment described above, the thickness $e_1$ of the thinned edges 114 is lower than or equal to about 80% or 75% of the initial thickness of the second substrate 102, the initial thicknesses of the first and second substrates 100, 102 being here substantially equal to each other and lower than or equal to about 725 µm. When the initial thicknesses of the first and second substrates 100, 102 are higher than about 725 µm, the thinning of the edges 114 of the first substrate 100 is made such that the thickness of the thinned edges 114 of the first substrate 100 is lower than or equal to about 580 µm or 544 µm.

The thinning is made such that the edges of at least one of both substrates 100, 102 have a thickness lower than or equal to about 580 µm or 544 µm, and a difference between the thicknesses of the edges of both substrates is at least 20% or 25% with respect to the other.

Figure 3:
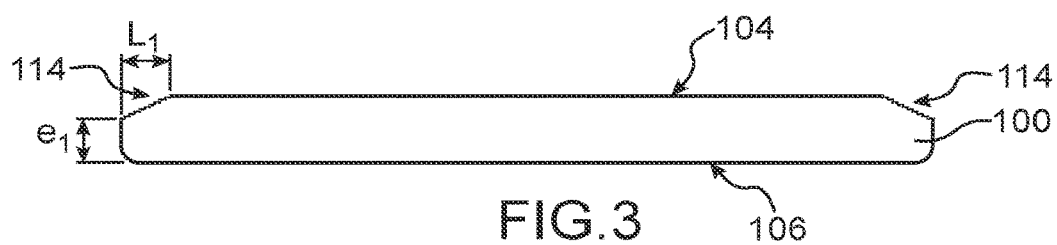
FIGS. 3 and 4 show alternative embodiments of a thinning of the edges of a substrate implemented during a method of direct bonding between two substrates, subject matter of the present invention.

In the particular embodiment described previously, the thinning of the edges 114 of the first substrate 100 is made such that the thickness $e_1$ of the thinned edges 114 of the first substrate 100 is substantially constant on the entire width $L_1$ in which this thinning is made. Alternatively, this thinning of the edges 114 of the first substrate 100 can be made such that the variation in thickness created by this thinning is less steep. For example, the thinning can be made such that the thickness of the thinned edges 114 decreases on at least one part of the width $L_1$ of the thinned edges 114. The edges 114 thus thinned are shown for example in FIG. 3. To make such edges 114, a cutting saw is used to make saw lines at the first face 104 of the first substrate 100. Because the depth of the saw lines formed in the substrate 100 can be controlled, it is possible to make the thinned edges 114 with different profiles, depending on the desired configuration. Such a saw can for example form a line with a width equal to about 1 mm. In the example of FIG. 3, 10 lines are successively made such that the thinned edges have a width $L_1$ equal to about 10 mm. Each line is made on a depth equal to 22.5 µm with respect to the previous line such that the minimum thickness $e_1$ of the thinned edges 114, at their end, is equal to about 500 µm (725 µm-10×22.5 µm).

Figure 4:
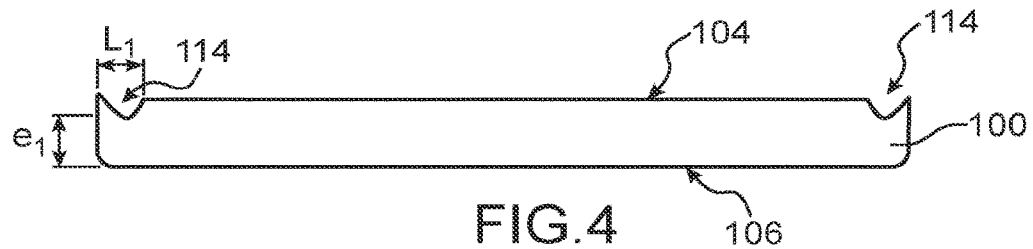

According to another alternative, the thinning can be made such that the thickness of the thinned edges 114 varies along a profile including at least two slopes. In the example of FIG. 4, the thickness of the thinned edges 114 varies according to a profile including two slopes, forming a "V" profile. Such a profile is for example made by making 10 saw lines successively such that the thinned edges have a width $L_1$ equal to about 10 mm. Each line is made on a depth equal to 45 µm with respect to the previous line such that the minimum thickness of the thinned edges 114, at the middle of the thinned edges, is equal to about 500 μm (725 μm−5×45 μm).

Other shapes or thinning profiles of the edges 114 can be contemplated. Moreover, lapping tools other than a cutting saw can be used to make thinning of the edges 114 of the first substrate 100.

Alternatively, it is also possible to make, before contacting both substrates 100, 102, a second thinning of the edges of the second substrate 102, at the first main face 108 of the second substrate 102. The different alternatives described previously for thinning the edges of the first substrate 100 can be applied for this second thinning. This second thinning can be made such that the thinned edges of at least one of both substrates have a thickness lower than or equal to about 580 μm or 544 μm, and that a difference between the thicknesses of the thinned edges of both substrates is at least 20% or 25% with respect to the other.

Alternatively, it is also possible to make, before contacting both substrates 100, 102, an oxidation of the first substrate 100, as a replacement or in addition to the oxidation of the second substrate 102.

In the examples described previously, the direct bonding which is made corresponds to a hydrophilic type bonding because of the hydrophilic nature of the materials being secured. Alternatively, the thinning of the edges of one or the substrates being secured can also be made in the case of a hydrophobic type direct bonding.

This direct bonding method is advantageously applied to the manufacture of a SOI substrate, or the transfer of circuits for making backlit imagers, or even for 3D applications.

The invention claimed is:

1. A method of direct bonding between at least a first and a second substrates, each of the first and second substrates comprising a first and a second main face, the method comprising:
   first thinning edges of the first substrate on at least one part of the circumference of the first substrate, at the first main face of the first substrate, wherein the first thinning is made such that a difference between a minimum thickness of the thinned edges of the first substrate and a thickness of edges of the second substrate is higher than or equal to about 20%, and a minimum value from the minimum thickness of the thinned edges of the first substrate and the thickness of the edges of the second substrate is lower than or equal to about 580 μm;
   contacting the second main face of the first substrate with the second main face of the second substrate such that a bonding wave propagates between the first and second substrates, securing the first and second substrates to each other by direct bonding such that the bonding interface between the second main face of the first substrate and the second main face of the first substrate includes a region located directly under thinned parts of the first main face of the first substrate.

2. The method according to claim 1, wherein, when the bonding wave is initiated from an initiating point located at the edges of the first and second substrates, said at least one part of the circumference of the first substrate corresponds to at least one third of the circumference of the first substrate and is located opposite to the initiating point.

3. The method according to claim 1, wherein the first thinning is made on the entire circumference of the first substrate.

4. The method according to claim 1, wherein the first thinning is made such that a difference between a minimum thickness of the thinned edges of the first substrate and a thickness of edges of the second substrate is higher than or equal to about 25%, and a minimum value from the minimum thickness of the thinned edges of the first substrate and the thickness of the edges of the second substrate is lower than or equal to about 544 μm.

5. The method according to claim 1, wherein the first thinning is made such that a width of the thinned edges of the first substrate is between about 1% and 25% of the diameter of the first substrate.

6. The method according to claim 1, wherein the first thinning is made such that the thickness of the thinned edges of the first substrate is substantially constant, or such that the thickness of the thinned edges decreases over at least one part of the width of the thinned edges, or such that the thickness of the thinned edges varies according to a profile comprising at least two slopes.

7. The method according to claim 1, further comprising, before contacting the second main face of the first substrate with the second main face of the second substrate, implementing a second thinning of at least one part of edges of the second substrate, at the first main face of the second substrate.

8. The method according to claim 1, wherein the direct bonding securing the first and second substrates to each other corresponds to a hydrophilic direct bonding.

9. The method according to claim 1, wherein the first and second substrates each comprise a semiconductor, and the method further comprising, before contacting the second main face of the first substrate with the second main face of the second substrate, implementing an oxidation of at least the second main face of at least one of the first and second substrates.

10. The method according to claim 1, further comprising, between the first thinning and the contacting of the second main face of the first substrate with the second main face of the second substrate, implementing a polishing of one end of the thinned edges of the first substrate.

* * * * *